United States Patent [19]

Dorman et al.

[11] Patent Number: 4,700,076
[45] Date of Patent: Oct. 13, 1987

[54] SOLID-STATE X-RAY RECEPTOR AND METHOD OF MAKING SAME

[75] Inventors: Arthur Dorman, Huntington, N.Y.; William K. Glave, Ashland, Va.; Curtis Birnbach, Bronx, N.Y.

[73] Assignee: Digital Imaging Company of America, Inc., Hauppauge, N.Y.

[21] Appl. No.: 529,035

[22] Filed: Sep. 2, 1983

[51] Int. Cl.⁴ .............................................. G01T 1/22
[52] U.S. Cl. ....................................... 250/370; 357/29
[58] Field of Search ........... 250/370 G, 370 J, 370 K, 250/332; 357/29, 63, 64, 61

[56] References Cited

U.S. PATENT DOCUMENTS

| | | | |
|---|---|---|---|
| 3,874,952 | 4/1975 | Woodall | 357/29 |
| 3,959,038 | 5/1976 | Gutierrez et al. | 357/29 |
| 4,034,396 | 7/1977 | Nakamura et al. | 357/61 |
| 4,214,253 | 7/1980 | Hall | 357/29 |
| 4,235,651 | 11/1980 | Kamath et al. | 357/63 |
| 4,255,659 | 3/1981 | Kaufman et al. | 250/370 G X |

FOREIGN PATENT DOCUMENTS 56-151377  11/1981  Japan ............................. 250/370 K

OTHER PUBLICATIONS

Carlson, D. et al., "Development of a Staring Mosaic Module", Proc. Soc. Photo-Opt. Inst. Eng., (SPIE), (1979), vol. 197, p. 2.
Eberhardt, J. et al., "High-Resolution Nuclear Radiation Detectors from Epitaxial n-GaAs", Applied Physics Letters, vol. 17, #10, p. 427, (11/1970).

Primary Examiner—Alfred E. Smith
Assistant Examiner—R. Hanig
Attorney, Agent, or Firm—Curtis, Morris & Safford

[57] ABSTRACT

An X-ray receptor for producing electrical signals representative of an X-ray image. An array of semiconductor elements is mounted on at least one support, each element being formed of semiconductor material which is (1) an element of Group 4A of the Periodic Table of Elements or a compound of such an element, or which is (2) at least one element of Group 3A of the Periodic Table of Elements together with at least one element of Group 5A of the Periodic Table of Elements, and having at least one PN junction therein. The array is positioned to receive impinging X-rays and to produce electrical signals in response thereto. Electrical conducting leads are supported on the support, and the electrical signals which are produced by respective ones of the semiconductor elements are coupled to these electrical conducting leads. Output terminals also are supported on the support to provide output image signals; and circuitry including multiplexing circuits additionally is supported on the support for processing and multiplexing the electrical signals from the electrical conducting leads to the output terminals. Also disclosed is a method by which the X-ray receptor is made.

20 Claims, 20 Drawing Figures

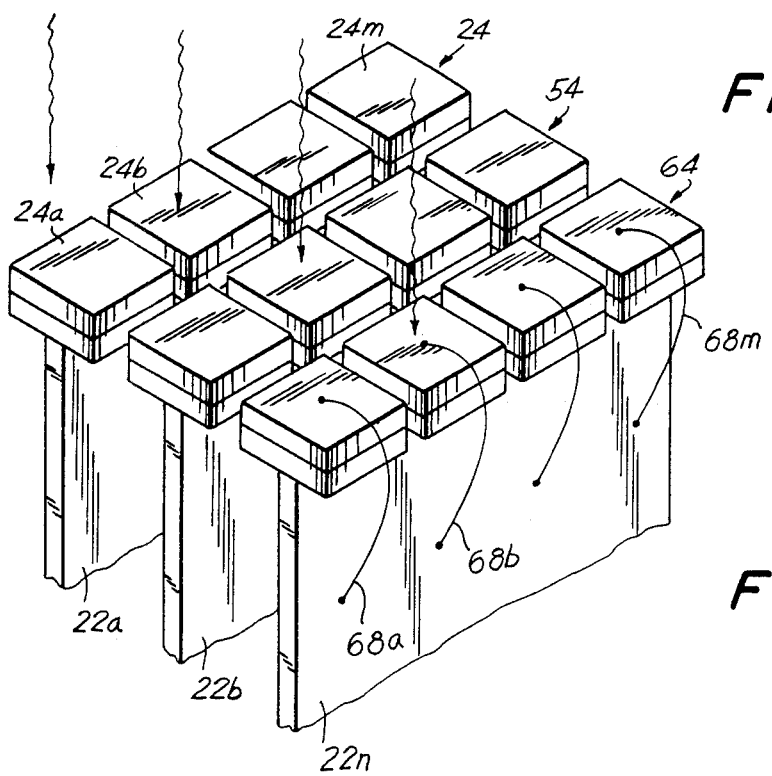
FIG.2
FIG.3
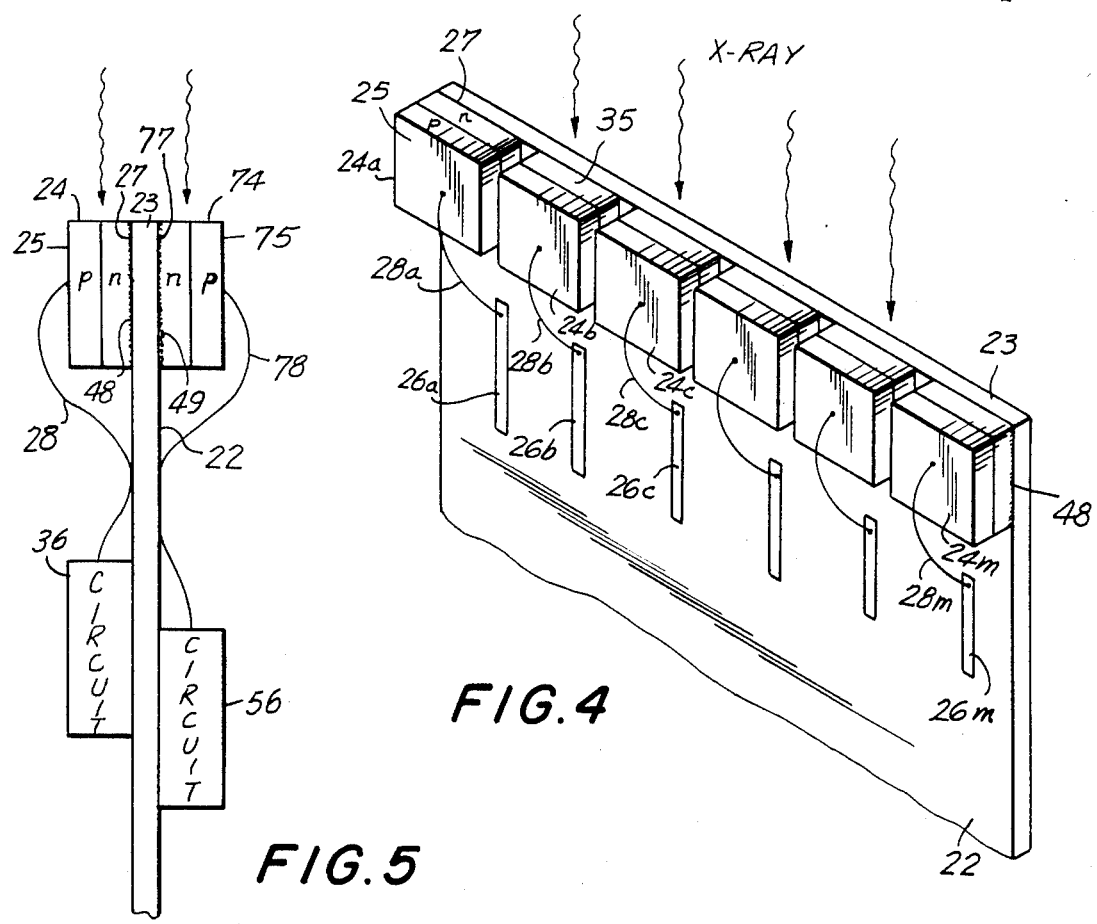
FIG.4
FIG.5

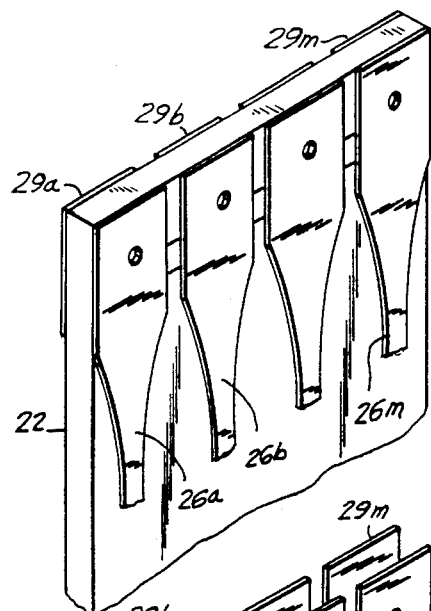
FIG.9A
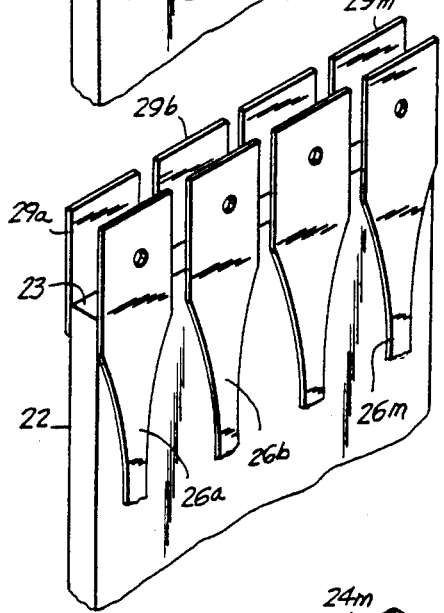
FIG.9B
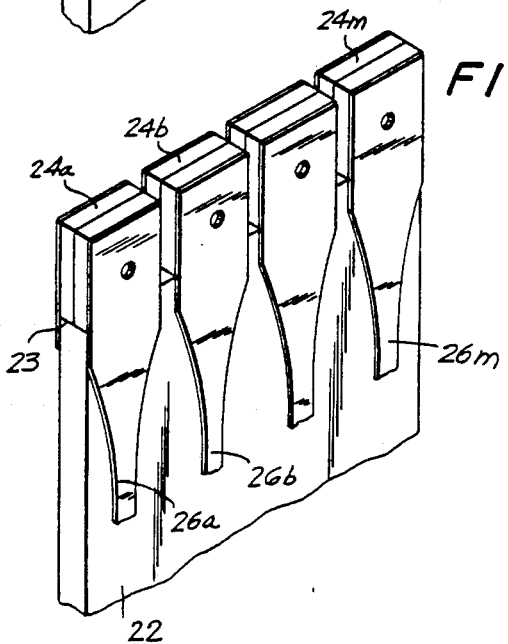
FIG.9C
FIG.10
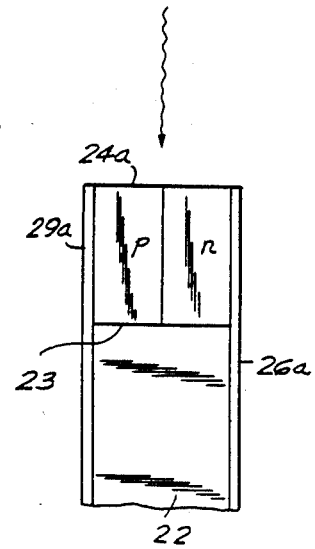
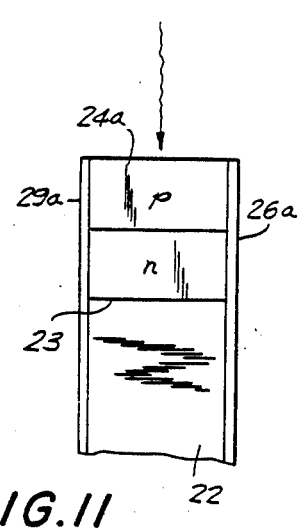
FIG.11

SOLID-STATE X-RAY RECEPTOR AND METHOD OF MAKING SAME

BACKGROUND OF THE INVENTION

This invention relates to an X-ray receptor and, more particularly, to a solid-state X-ray receptor, a method of making that receptor, and the manner in which the X-ray receptor is used to produce electrical signals representing an X-ray image. Although the invention finds particular application in the field of medical diagnostics, it also is applicable to the general field of X-ray imaging, including mechanical structural analysis, article detection and sensing, and the like.

X-ray imaging has long been used for medical diagnostics. Typically, a patient is exposed to X-radiation which is transmitted from a suitable source through the patient to impinge upon an X-ray sensitive film or plate. The resultant X-ray image is developed, analogous to the development of a photographic image, from which a suitably trained physician may diagnose the the patient's condition. While this technique has been generally accepted in the health care industry, it suffers from notable disadvantages and deficiencies. For example, a delay of several minutes to several hours in the development of the X-ray image may occur. As a result, prompt analysis and diagnosis, although desirable, may not be possible. Furthermore, when X-ray image development is carried out in a large facility, such as a large metropolitan hospital, the exposed X-ray film or plate may be misplaced or lost and, notwithstanding safeguards that may be employed, the developed image may be falsely identified.

Another disadvantage associated with conventional X-ray imaging techniques is the delay and inconvenience that may result if repeated or additional images are needed. For example, if one X-ray image is not satisfactory, a substitute may be needed. However, the adequacy of the original image might not be ascertained until long after that image has been made and developed. In a large facility, such as mentioned above, a patient may be recalled days later or, in the alternative, the patient may be required to spend many idle hours at that facility awaiting the determination of whether a substitute X-ray image is needed. Similarly, if the technician or physician determines that an alternative X-ray image is needed from, for example, a different angle or direction, the patient must be recalled or must remain at the facility until this determination is made. To minimize the inconvenience of recalling or retaining the patient, it is not uncommon for X-ray technicians to take multiple images from several different directions or angles of the same patient with the expectation that at least one of such images will be satisfactory. However, multiple exposures results in subjecting the patient to higher dosages of X-radiation, which is not desirable.

A still further problem associated with present-day X-ray imaging techniques is the requirement of maintaining a relatively large inventory of X-ray film or plates for X-ray exposure and an even larger library of exposed film. In addition to the expense attending such a large inventory, it also is necessary to provide high quality control to assure that such film or plates are of good quality. In addition, a suitable laboratory or other facility is needed to process the exposed X-ray film or plates. Additionally, a considerable amount of time and money are expended in maintaining the aforementioned film library and in manually handling the film each time one or more exposed images is recalled from and then returned to the library.

There has, therefore, been a long-felt need for a so-called "real time" X-ray receptor which produces electrical signals directly in response to impinging X-radiation, which signals are processed to produce a viewable image on, for example, a cathode ray tube. Fluoroscopic apparatus has been known for some time; but this is less than satisfactory in many applications because of, for example, the limited dynamic range (perceived as contrast) of the image intensifier normally used with such apparatus, and the further degeneration of images that are displayed by conventional television techniques. With the advent of sophisticated digital processing, it is desirable to produce electrical signals representing an X-ray image, as opposed to a mere fluoroscopic image which is produced directly from X-radiation. Such image-representing signals, when converted into the proper format for digital processing (i.e. when they are "digitized"), may be suitably processed, image-enhanced, stored and recalled (e. g. magnetic or optic recording). The digitized image-representing signals advantageously may be supplied to and used by digital micro-computers whose capability of performing algorithmic functions on the image information substantially enhances and exploits the raw data present in the image-representing signals.

It has been proposed heretofore to provide X-ray image pickup tubes of a type similar to television or video pickup tubes. Such tubes are, however, difficult and expensive to manufacture. Moreover, such X-ray imaging tubes must be handled with great care to avoid damage. Furthermore, such tubes generally require relatively high electrical voltages and currents for proper operation. Still further, it is not practical to construct an X-ray image pickup tube having a pickup screen, or surface, that is comparable in size to that of conventional X-ray film or plates. As a typical example, such film or plates may be on the order of 14×17 inches; and it is quite difficult to produce a pickup tube whose screen is of this size.

The aforementioned problems associated with X-ray image pickup tubes are overcome by the present invention which provides a solid-state X-ray receptor that produces signals readily adapted for digital processing, storage, and enhancement. It is believed that, heretofore, solid-state X-ray imaging devices have not been practical due, in part, to the inability of utilizing satisfactory solid-state X-ray imaging elements. Although semiconductor photodetecting elements have long been known, such elements generally are not acceptable for use in X-radiation environments. For example, silicon photodiodes are soon rendered inoperative or destroyed when exposed to X-rays. Other semiconductor materials are responsive to radiant energy whose wavelengths lie in the ultraviolet, visible and infrared bands, but not to energy having the much smaller wavelengths that constitute the X-ray band. Reference is made herein to Chapter 6 of the text "Integrated Circuits and Semiconductor Devices" by Deboo et al., McGraw-Hill Book Company (1971) for a discussion of such photodetectors.

Another difficulty that is associated with solid-state X-ray receptors is that, assuming a suitable semiconductor X-ray responsive material is known, a satisfactory imaging device using this material must be formed of several semiconductor elements, each used to produce a "picture element" or "pixel", representing a discrete small area of the X-ray image. The necessary array of elements must be suitably supported in a plane so as to produce the corresponding pixel signals. Such elements must be closely spaced both in the horizontal and vertical directions. As a numerical example, a suitable array should be formed of 1024×1024 such elements. Heretofore, it has not been thought practical to support over one million semiconductor elements in proper orientation, to receive the signals produced by each element and to process those signals so as to result in a suitable viewable image. Rather, a single X-ray detector (whose construction is not readily ascertainable) has been moved from point-to-point in order to produce a composite X-ray image (see, for example, U.S. Pat. No. 4,128,877), or a linear array of detectors (whose construction also is unknown) has been provided in a movable yoke that also is moved in order to reconstruct a composite image (see, for example, U.S. Pat. Nos. 4,136,388 and 4,259,721). The requirement of moving a single detector or a linear array of detectors is time-consuming, often resulting in movement by the patient, which reduces the quality of the X-ray image and information contained therein, and is further subject to displacement errors inherent in the movement of the detectors from point-to-point.

OBJECTS OF THE INVENTION

Therefore, it is an object of the present invention to provide an improved X-ray receptor which overcomes the aforenoted problems and disadvantages.

Another object of this invention is to provide a solid-state X-ray receptor formed of semiconductor elements which are satisfactorily responsive to X-radiation and which are not subject to damage or destruction due to impinging X-rays.

A further object of this invention is to provide an X-ray receptor formed of a matrix array of semiconductor elements.

An additional object of this invention is to provide an X-ray receptor that can be manufactured relatively inexpensively.

Another object of this invention is to provide an X-ray receptor that produces signals readily adapted for digital processing, enhancement, long-term storage (on magnetic or optical record media) and retrieval (magnetic or optical disc playback), and the like.

Yet another object of this invention is to provide a solid-state X-ray receptor that is of relatively compact construction.

A still further object of this invention is to provide a solid-state X-ray receptor wherein linear arrays of semiconductor elements are mounted on respective insulating supports, these supports also having electrical conducting leads and control circuitry thereon such that the electrical signals produced by the respective semiconductor elements are supplied to the control circuitry from which output electrical signals are derived for use by other apparatus, such as digital X-ray image signal processing apparatus.

A still additional object of this invention is to provide a method by which the aforementioned X-ray receptor is produced.

Various other objects, advantages and features of the present invention will become readily apparent from the ensuing detailed description, and the novel features will be particularly pointed out in the appended claims.

SUMMARY OF THE INVENTION

In accordance with the general teachings of this invention, a solid-state X-ray receptor is provided. In its more general form, the X-ray receptor is comprised of a matrix array of semiconductor elements, each element producing a respective electrical signal representing a pixel of the X-ray image.

In one embodiment of this invention, a linear array of semiconductor elements is mounted on a support, each element being formed of semiconductor material which is (1) an element of Group 4A of the Periodic Table of Elements or a compound of such an element, or which is (2) at least one element of Group 3A of the Periodic Table of Elements together with at least one element of Group 5A of the Periodic Table of Elements, and having at least one PN junction therein. The support also has electrical conducting leads and control circuitry thereon, the latter including multiplexing circuitry, and means are provided to couple the electrical signals produced by respective ones of the semiconductor elements to the electrical conducting leads, these signals then being operated upon by the control circuitry and supplied to output terminals which also are provided on the support. In a preferred embodiment, m semiconductor elements are provided in the linear array, and n supports, each having a linear array of elements thereon, are provided, thus resulting in a matrix array of $m \times n$ elements.

The semiconductor elements may be mounted on the support in various arrangements. For example, in one embodiment, the elements are mounted on the leading edge of the support such that the X-ray receiving surface of those elements lies in a plane which is substantially normal to the surface of the support. Individual wires may be bonded between the aforementioned conducting leads and the P-type (or N-type) material of each element. In another embodiment, each element may be mounted on the leading edge of the support and additionally soldered or otherwise electrically bonded to a common conducting lead which is formed as, for example, a stripe immediately adjacent the leading edge.

As still another embodiment, each semiconductor element may be mounted on a surface of the support adjacent the leading edge thereof. In this embodiment, each conducting lead may extend to the leading edge and a respective element may be bonded, soldered or otherwise electrically coupled to that conducting lead. As an alternative, a common conducting lead may be formed as a stripe on the support adjacent the leading edge thereof, and each semiconductor element may be soldered or bonded to that common conducting lead. In this alternative, the P-type (or N-type) material is electrically connected to the common conducting lead, and the other material, i.e. the material on the other side of the PN junction, is connected by wire bonding to the individual conducting leads which are provided on the surface of the support.

As a modification of the aforementioned embodiments, one linear array may be mounted on one surface of the support, adjacent the leading edge of the latter, and another linear array may be similarly mounted on the other surface of that support. Control circuitry associated with the respective arrays are supported on the corresponding surfaces of the support. A plurality of such supports having respective linear arrays mounted thereon form the m×n matrix array of semiconductor elements.

In yet another embodiment of the present invention, the linear array of semiconductor elements is suitably formed and supported by depositing plural electrical leads on both surfaces of the support, these leads extending up to the leading edge of that support. Electrical circuitry, including the aforementioned multiplexing circuitry, is mounted on the support, this circuitry being connected to at least some of the aforementioned leads. A predetermined peripheral edge section of the support is removed, thereby resulting in the electrical leads projecting beyond the remaining leading edge of the support, and the removed section is replaced with the array of semiconductor elements. Each element thus is sandwiched between a pair of leads, these leads being disposed on opposite surfaces of the support. It will become apparent that other techniques may be used to form this embodiment of the X-ray receptor.

BRIEF DESCRIPTION OF THE DRAWINGS

The following detailed description, given by way of example, will best be understood in conjunction with the accompanying drawings in which:

FIG. 2 is a perspective, schematic diagram of a matrix array of edge-mounted semiconductor elements in accordance with the present invention;

FIG. 3 is a side, schematic diagram of another embodiment of edge-mounted semiconductor elements;

FIG. 4 is a perspective, schematic diagram of surface-mounted (or periphery-mounted) X-ray responsive semiconductor elements in accordance with the present invention;

FIG. 5 is a side, schematic diagram of a modification of the embodiment shown in FIG. 4;

FIGS. 9A-9C are perspective, schematic diagrams representing one technique by which an array of suitably mounted X-ray responsive semiconductor elements may be formed;

FIGS. 10 and 11 are side, schematic diagrams of alternative embodiments of the array constructed in accordance with the technique illustrated in FIGS. 9A-9C;

DETAILED DESCRIPTION OF CERTAIN PREFERRED EMBODIMENTS

Figure 1A:
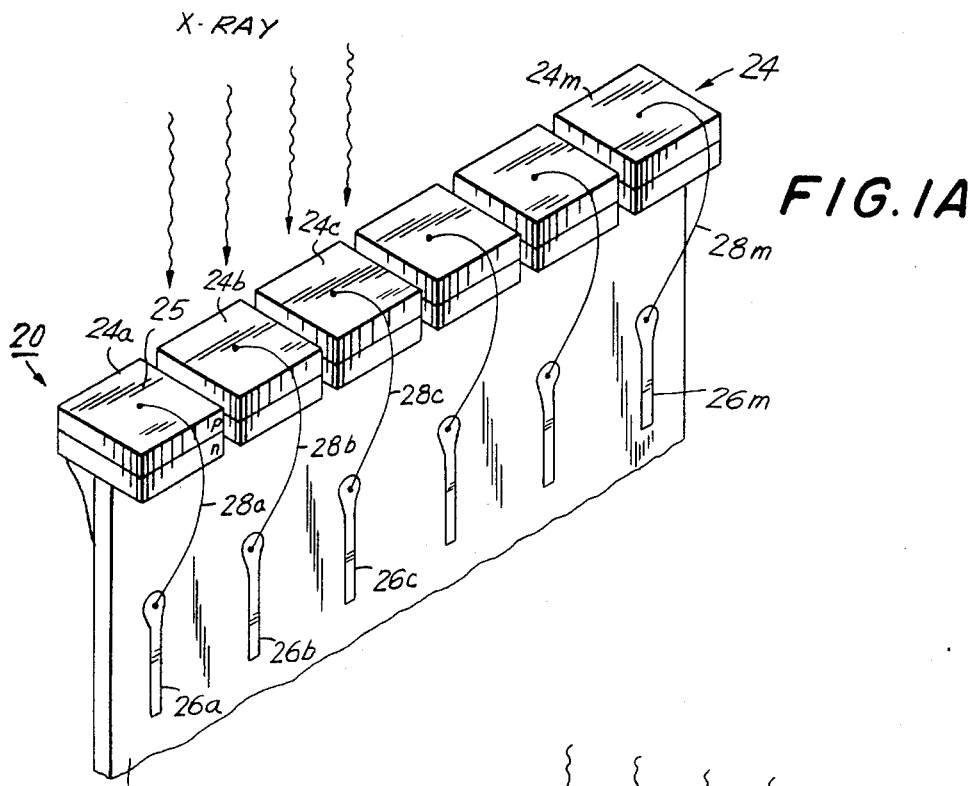
FIGS. 1A and 1B are perspective, schematic diagrams of one embodiment of edge-mounted X-ray responsive semiconductor elements, in accordance with the present invention.
Figure 1B:
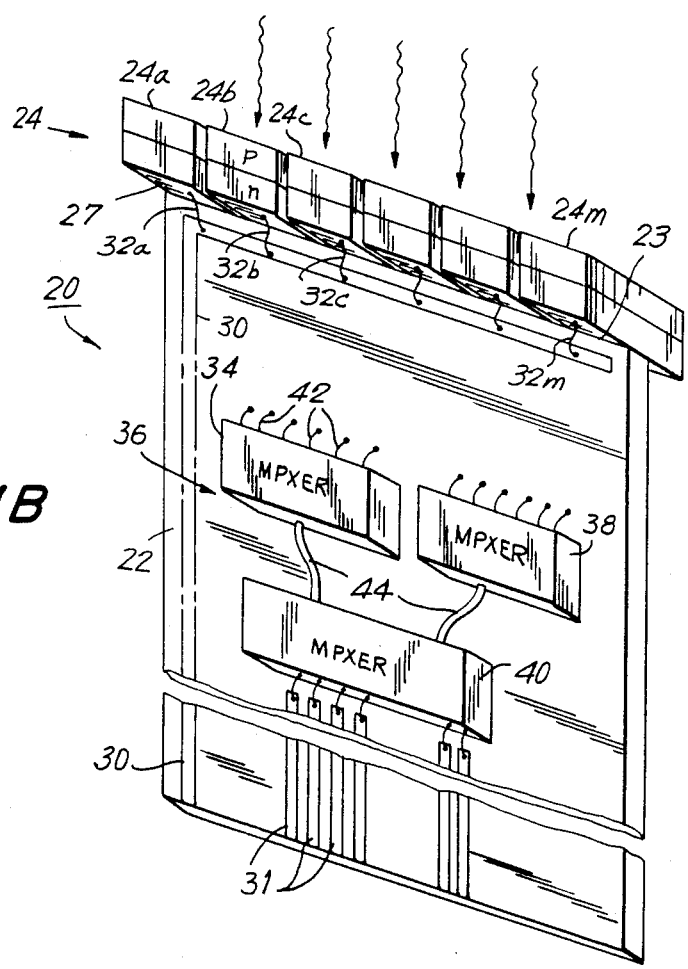

Referring now to the drawings, wherein like reference numerals are used throughout, FIGS. 1A and 1B are perspective, schematic diagrams representing one embodiment of X-ray receptor 20 in accordance with the present invention. In the illustrated embodiment, an array 24 of semiconductor elements is mounted on an edge 23, sometimes referred to herein as the "leading edge" or "peripheral edge", of a support 22 (preferably, an insulating support board) and is designated, for convenience, an edge-mounted array. Although not shown, the elements may be mounted on a side edge of the support. The semiconductor elements may be mounted on edge 23 by a suitable adhesive, by ultrasonic welding, or by other conventional mounting techniques. Preferably, the support is a ceramic circuit board of suitable construction on which conducting leads may be deposited in accordance with conventional lead-deposition techniques. As an example, electrical conducting leads 26a, 26b . . . 26m are deposited, or supported, on one surface of support 22, such as shown in FIG. 1A.

Each semiconductor element 24a, 24b, . . . 24m included in array 24 has at least one PN junction therein. Preferably, the semiconductor material which is used to form each element is from the 3-4-5 Groups of the Periodic Table of elements. That is, this material is formed of at least one element from Group 3A of the Periodic Table and at least one element from Group 5A. If desired, an element from Group 4A or a compound of such an element may be used, as described below. It is known that these elements exhibit good semiconductor characteristics and, for example, the Group 3A elements exhibit P-type acceptor impurities and the Group 5A elements exhibit N-type donor impurities. Hence, with suitable dopants, the Group 3A elements are included in the P-type material on one side of the PN junction, and the Group 5A elements are included in the N-type material on the other side of the PN junction. The P-type material may include one or more of boron, aluminum, gallium, indium and thalium, and the N-type material may include one or more of phosphorus, arsenic, antimony and bismuth. In particular, satisfactory results have been achieved by forming each semiconductor element as gallium arsenide or as gallium phosphide or as gallium aluminum arsenide or as gallium arsenic phosphide. Gallium aluminum arsenide has, thus far, attained the best results in producing an output electrical signal in response to impinging X-rays. Such results can be improved, or "tuned", by doping the semiconductor element so as to vary the spectral response characteristics thereof. Similarly, it is believed that such doping likewise can improve the response of semiconductor elements formed of others of the aforementioned compounds. The use of gallium aluminum arsenide as a semiconductor element has thus far been attempted only in light emitting or infrared emitting diodes, such as those manufactured by Xciton Corporation of Latham, N.Y. Of the Group 4A elements, silicon, germanium and lead may be used as, for example, properly doped silicon or germanium diode-type devices, or lead compounds described below.

Photodetectors employing 3-5 compounds have been suggested heretofore, such as in the article "Photodiodes for Long-Wavelength Communications Systems" by S. R. Forrest, Fiberoptic Technology, December 1982, page 81, but the wavelengths to which such 3-5 compounds respond are far longer than X-ray wavelengths.

It is expected that a silicon PIN photovoltaic device would exhibit the best sensitivity to impinging X-rays. That is, the dynamic range of the output signal attained from the silicon PIN element would be greater than that of, for example, the aforementioned 3-5 compounds. However, it is known that the silicon PIN element will deteriorate upon exposure to X-radiation, thus making it impractical for use in an X-ray receptor. Other compounds also have been tested, such as cadmium sulfide, cadmium selenide, cadmium telluride, germanium, lead oxide, lead sulfide, lead selenide, lead telluride and selenium. Output signals were produced by these semiconductor elements in response to impinging X-rays, but such signals do not exhibit a dynamic range as great as that produced by the aforementioned 3-5 compounds. In addition, the semiconductor element formed of lead telluride requires a very low temperature environment.

In testing various semiconductor materials for use as semiconductor elements 24, X-rays were transmitted through a water/aluminum "phantom", the thickness of the aluminum being varied to simulate different anatomical portions of a human subject. The X-ray beam current was set at about 100 ma, and the X-ray energy was varied from 40 KVP to 120 KVP. With this variation in X-ray beam energy, the signal output produced by the gallium arsenic phosphide element was in the range of 1-30 millivolts. In comparison therewith, the signal output produced by the gallium aluminum arsenide element was in the range of 10-50 millivolts. Of course, as the thickness of the aluminum contained in the phantom is increased, the voltage level of the output signal produced by the semiconductor element in response to impinging X-rays decreases.

As mentioned above, each semiconductor element preferably includes at least one PN junction therein. In accordance with fabrication techniques that have been used in producing PN junction photodiodes, the thickness of the P-type material may be less than the thickness of the N-type material. Moreover, the surface of the P-type material may be provided with the usual window through which the X-rays pass. For example, this window may be formed generally in the center of this surface, surrounded by an annular contact, and the surface of the N-type material may be coated, either in whole or in part, with a contact. As an alternative, the surface of the N-type material may be exposed to the impinging X-rays and the thickness thereof may be less than the thickness of the P-type material. Still further, the semiconductor element may be constructed as a multi-layer device such as described in the aforementioned Forrest article, and may include several PN junctions therein.

In one embodiment of the present invention, the material on one side of the PN junctions in each semiconductor element, for example, the N-type material, is electrically connected to a common conducting lead 30 by, for example, individual wires 32a, 32b . . . 32m, as shown in FIG. 1B. This common conducting lead may be supplied with a suitable bias potential, such as ground potential, or a reverse bias voltage, such as a positive potential. Likewise, the material on the other side of the PN junction in each semiconductor element, such as the P-type material, is connected to a respective one of electrical conducting leads 26a, 26b, . . . 26m by a wire 28a, 28b, . . . 28m, respectively, bonded between the semiconductor element and the conducting lead. In this embodiment, the conducting leads are supplied with respective signals produced by elements 24a, 24b, . . . 24m in response to the X-radiation received by those elements. In an alternative embodiment, a so-called "enable" signal may be supplied in, for example, a predetermined sequence, to conducting leads 26a, 26b, . . . 26m to enable the respective semiconductor element connected thereto to supply the aforementioned electrical signal to common conducting lead 30. It is appreciated that in this alternative embodiment, successive electrical signals supplied to lead 30 represent the X-radiation received by successive ones of the semiconductor elements.

In the first-mentioned embodiment, wherein the electrical signals produced by semiconductor elements 24a, 24b, . . . 24m are supplied to conducting leads 26a, 26b, . . . 26m, respectively, these conducting leads are coupled to control circuitry 36 which, as shown in FIG. 1B, is comprised of individual circuit elements which are mounted on a surface of support 22. In the illustrated embodiment, circuitry 36 is mounted on the surface opposite that on which conducting leads 26 are deposited. Accordingly, the conducting leads are coupled via conventional through-holes (not shown) and connected to the control circuitry by means of wire leads 42. The control circuitry preferably includes conventional amplifiers by which the electrical signals produced by the respective semiconductor elements are amplified to desirable levels, multiplexer circuits, and other control circuitry such as timing circuits, and the like (not shown). For simplification, the aforementioned amplifiers are not illustrated in the drawings.

FIG. 1B merely shows one embodiment of multiplexer circuits 34, 38 and 40 which are used to multiplex m electrical signals produced by the m respective semiconductor elements to output terminals 31. Merely for illustrative purposes, multiplexer circuits 34 and 38 are seen to be electrically connected to multiplexer circuit 40 by means of conducting leads 44 which are deposited on the surface of support 22 in much the same manner as the deposition of conducting leads 26. Again, for illustrative purposes only, multiplexer 40 is illustrated as including a plurality of output leads which are coupled, by means of wire bonding, to output terminals 31. If desired, multiplexer circuit 40 may include a single output lead that is coupled to a single output terminal.

As an example, each of the illustrated multiplexer circuits may comprise a conventional analog multiplexer having, for instance, sixteen analog input terminals and one analog output terminal, such as analog multiplexer Model IH6116, manufactured by Intersil Inc. of Cupertino, Calif. Although not shown, suitable multiplexer driving circuitry, such as clock circuits and the like, also may be mounted on support 22 in order to drive the illustrated multiplexers accordingly.

In the alternative embodiment wherein the electrical signals produced by the semiconductor elements in response to impinging X-radiation are supplied to common conducting lead 30, the illustrated multiplexers are replaced by demultiplexing circuits which apply the aforementioned enable signals (such as clock signals), in sequence, to respective ones of conducting leads 26a, 26b, . . . 26m and thence to semiconductor elements 24a, 24b, . . . 24m, respectively. It will be appreciated that, in both embodiments, common conducting lead 30 is coupled to a suitable output terminal. As will be described below, the output terminals are connected to further apparatus.

In the embodiments described hereinabove, the electrical signals produced by the semiconductor elements included in array 24 are effectively scanned by control circuitry 36 to supply successive analog pixel-representing signals to one or more of output terminals 31, the latter being provided along the trailing edge (for example) of support 22. These analog signals are converted to digital signals for processing by suitable signal processing apparatus, the latter forming no part of the present invention per se. If desired, the digital-to-analog (D/A) converting circuitry may be mounted directly on support 22 or, alternatively, may be included in the signal processing apparatus.

In the embodiment shown in FIGS. 1A and 1B, control circuitry 36 and conducting leads 26a, 26b, . . . 26m are mounted on opposite surfaces of support 22. If desired, however, these electrical conducting leads may be deposited on the same surface as the control circuitry.

The X-ray receptor illustrated in FIGS. 1A and 1B represents one embodiment of a linear array of semiconductor elements. As illustrated, each element includes a top surface 25 which is positioned to receive impinging X-radiation and a bottom surface 27 which is mounted on leading edge 23 of support 22. Top surface 25 of each element included in array 24 lies in a plane which is substantially normal to either surface of the support (i. e. either the surface upon which conducting leads 26 are deposited or the surface upon which control circuitry 36 is mounted). Preferably, the X-ray receptor of the present invention is used to form an m×n matrix array of semiconductor elements. This may be achieved in the manner illustrated in FIG. 2, wherein a plurality of supports 22a, 22b, . . . 22n, each being of the type shown in FIG. 1A and having m semiconductor elements mounted therein, is provided. As shown, support 22a supports semiconductor elements 24a, 24b, . . . 24m, and supports 22b and 22n support linear arrays 54 and 64, respectively, these linear arrays being similar to linear array 24. Although not shown in FIG. 2, it will be appreciated that each support has electrical conducting leads similar to leads 26 deposited thereon and control circuitry similar to control circuitry 36 mounted thereon. Each semiconductor element in a respective array is coupled to a respective one of the electrical conducting leads in the manner shown in FIG. 1A; and this is represented by, for example, wires 68a, 68b, . . . 68m which connect the respective semiconductor elements in array 64 to corresponding ones of such conducting leads. Similarly, each support shown in FIG. 2 has a common conducting lead deposited thereon, similar to common conducting lead 30 shown in FIG. 1B, to which are connected all of the semiconductor elements included in the array that is mounted on that support.

Thus, in the embodiment shown in FIG. 2, it is seen that n×m semiconductor elements are provided in a matrix array; the top surface of each element laying in a plane that is substantially normal to each support. X-radiation impinges upon these top surfaces, and each semiconductor element responds to the impinging X-radiation to produce a corresponding electrical signal. These electrical signals then are multiplexed on each support and supplied to one or more output terminals, similar to output terminals 31 of FIG. 1B, for transmission (e. g. by direct electrical connection) to further apparatus.

Yet another embodiment of the X-ray receptor of the present invention is illustrated schematically in FIG. 3. This embodiment represents a single semiconductor element 24 which is mounted on leading edge 23 of support 22. As described above, the semiconductor element may be mounted by a suitable adhesive, ultrasonic welding, or the like. In this embodiment, a common conducting lead 47 is deposited as a stripe immediately adjacent leading edge 23. The material on one side of the PN junction included in semiconductor element, such as the N-type material, is electrically connected to common conducting lead 47 by means of solder 48. Alternatively, other conventional electrical bonding techniques may be used in place of solder to electrically connect the semiconductor element to the common conducting lead. FIG. 3 also illustrates the use of wire 28 bonded from the material on the other side of the PN junction, for example, from the P-type material, to a respective conducting lead 26 deposited on the surface of support 22.

It is believed that the response characteristic of each semiconductor element to impinging X-radiation is a volumetric characteristic. That is, the electrical signal produced by each element is a function of the volume thereof and not the surface area which is exposed to the X-rays. Therefore, it is expected that substantially the same electrical signal will be produced by the semiconductor element having the same volume as that shown in FIGS. 1A and 1B even if top surface 25 thereof is not exposed directly to the impinging X-rays. Consequently, another embodiment of the present invention may be constructed in the manner shown schematically in FIG. 4. In this embodiment, surface 27 of each semiconductor element is electrically connected by solder 48, or other electrical bonding techniques, to a common conducting lead which may be of the type shown in FIG. 3 as conducting lead 47. That is, array 24 is mounted on a surface of support 22 adjacent leading edge 23 thereof, and for convenience may be designated a periphery-mounted array. In the embodiment of FIG. 4, the N-type material of each semiconductor element is electrically connected to the aforementioned common conducting lead, and the P-type material is coupled by, for example, wire bonds 28a, 28b, . . . 28m to a respective one of conducting leads 26a, 26b, . . . 26m, respectively. In the interest of simplification, FIG. 4 does not illustrate control circuitry 36. Nevertheless, it will be appreciated that such circuitry may be mounted on one or the other surface of the support, in the manner described above with respect to the embodiments of FIGS. 1A and 1B.

In the embodiment of FIG. 4, X-radiation is transmitted to the X-ray receptor in a direction substantial parallel to surface 25 of each semiconductor element. Nevertheless, by reason of the volumetric response characteristic of each semiconductor element, mentioned above, the electrical signals produced thereby will be of substantially the same voltage levels as the electrical signals produced by the embodiment shown in FIG. 1A and 1B. Of course, each semiconductor element still includes a surface, shown as surface 35, that is substantially normal to the surface of support 22 and upon which X-radiation impinges.

An alternative of the embodiment shown in FIG. 4 is depicted in FIG. 5. In this alternative embodiment, each support 22 is provided with two arrays 24 and 74 mounted on opposite surfaces of the support, both arrays being adjacent leading edge 23. Each semiconductor element included in array 24 is provided with a surface 27 that is electrically connected to a common conducting lead, or stripe, on one surface of support 22 by means of solder 48 or other conventional electrical bonding. Likewise, a similar surface 77 of each semiconductor element included in array 74 is electrically connected by solder 49 or other electrical bonding to a common conducting lead on the opposite surface of the support. The other surfaces 25 and 75 of the semiconductor elements included in arrays 24 and 74, respectively, are connected to respective electrical conducting leads deposited on the opposite surfaces of support 22 by means of wire bonds 28 and 78, respectively. It will be appreciated that the electrical conducting leads deposited on the opposite surfaces of the support are connected to control circuitry 36 and 56, respectively, such control circuitry being mounted, for convenience, on the opposite surfaces of the support. Control circuitry 56 may be similar to aforedescribed control circuitry 36 and, although not illustrated in detail in FIG. 5, may be of the type and have the electrical interconnection described above with respect to FIG. 1B. Such control circuitry is, in turn, electrically connected to output terminals deposited on opposite surfaces of support 22.

Thus, in the embodiment shown in FIG. 5, the electrical signals produced by the semiconductor elements included in arrays 24 and 74 are coupled to output terminals which, in turn, are connected to further apparatus, such as image signal processing apparatus (not shown). The output terminals in FIG. 5 thus perform a similar function to the output terminals described above with respect to FIG. 1B, and provide output image signals for further processing.

For convenience, the embodiment of FIG. 5 illustrates the N-type material in each semiconductor element as being connected to a common conducting lead, and the P-type material as supplying individual electrical signals to the control circuitry. Alternatively, the P-type material may be connected to the common conducting lead and the N-type material may supply the electrical circuits to the circuitry. Still further, and as mentioned above with respect to the embodiment of FIGS. 1A and 1B, the control circuitry 36 and 56 may operate to enable successive ones of the semiconductor elements included in arrays 24 and 74 to supply successive electrical signals to the common conducting leads deposited on the respective surfaces of the support.

Figure 6:
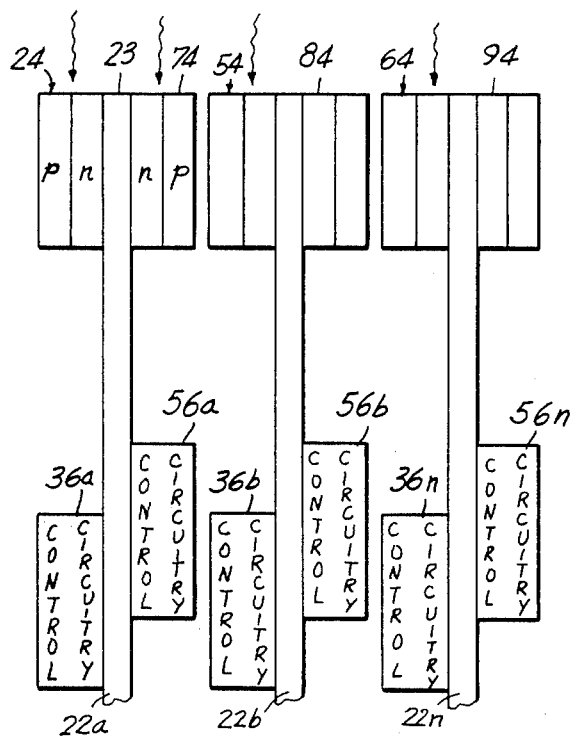
FIG. 6 is a side, schematic diagram of a matrix array of semiconductor elements utilizing the embodiment shown in FIG. 5.

When the embodiment shown in FIG. 5 is used as a matrix X-ray receptor, a plurality of supports are used, as shown in FIG. 6. It is seen that n supports 22a, 22b, . . . 22n are provided, each support having two linear arrays mounted thereon, each linear array being disposed on a respective surface of the support adjacent leading edge 23 thereof. For example, linear arrays 24 and 74 of semiconductor elements are mounted on support 22a, linear arrays 54 and 84 are mounted on support 22b and linear arrays 64 and 94 are mounted on support 22n. Suitable control circuitry is mounted on a respective surface of each support, such control circuitry being connected to a respective linear array in the manner discussed in detail above. Thus, control circuitry 36a on support 22a is electrically connected to linear array 24, and control circuitry 56a on this support is electrically connected to array 74. Likewise, control circuitry 36b and 56b on support 22b are connected to arrays 54 and 84, respectively. The remaining control circuitry is connected in a similar manner and, as illustrated, control circuitry 36n and 56n mounted on support 22n are electrically connected to arrays 64 and 94, respectively.

Figure 7:
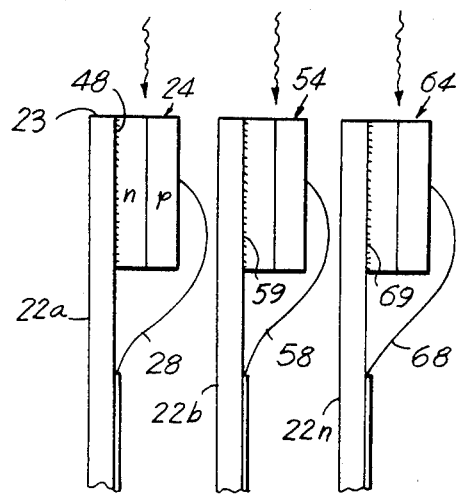
FIG. 7 is a side, schematic diagram of a matrix array of semiconductor elements utilizing the embodiment shown in FIG. 4.

In an analogous manner, the embodiment shown in FIG. 4 may be provided in a matrix X-ray receptor of the type schematically illustrated in FIG. 7. Here, n supports 22a, 22b, . . . 22n, each having an array of semiconductor elements 24, 54, . . . 64, respectively mounted thereon in the manner shown in FIG. 4 are provided. As shown in FIG. 7, each support 22a, 22b, . . . 22n may be provided with a common conducting lead deposited in the form of a stripe adjacent leading edge 23 thereof, and the individual semiconductor elements included in each array are soldered to that common conducting lead. The elements included in array 24 are soldered to the common conducting lead deposited on support 22a by means of solder 48. Of course, as described above, other conventional electrical bonding may be provided between these elements and the common conducting lead. Similarly, solder 59 (or other electrical bonding) connects the elements included in array 54 to the common conducting lead deposited on support 22b. Similar electrical connections are provided between the remaining arrays and the common conducting leads provided on the respective supports and, as shown, solder 69 (or other electrical bonding) connects the elements included in array 64 to the common conducting lead deposited on support 22n. Also, the individual electrical conducting leads which are deposited on each support are connected by, for example, wire bonding to the semiconductor elements included in each respective array. In the illustrated embodiment, the N-type material in each element is connected to the common conducting lead, and the P-type material is connected by wire bonding to the electrical conducting leads.

Figure 8A:
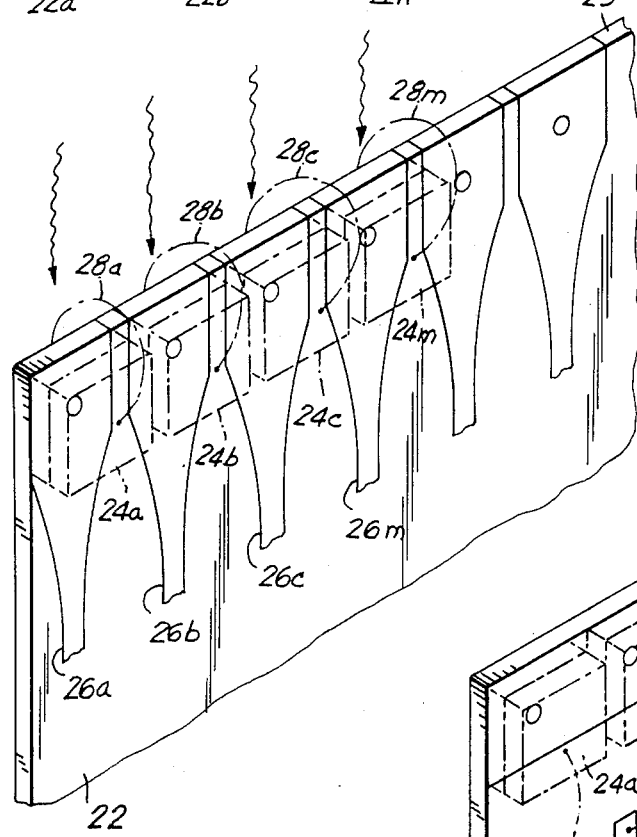
FIGS. 8A and 8B are perspective, schematic diagrams of embodiments of the type similar to that shown in FIG. 4.

FIG. 8A represents yet another alternative in the manner by which the semiconductor elements are mounted on support 22. Here, the respective electrical conducting leads 26a, 26b, . . . 26m are seen to extend to leading edge 23 of the support. Each semiconductor element is connected directly, by solder or other conventional electrical bonding, to such electrical conducting leads. In the illustrated embodiment, each conducting lead terminates in a suitable mounting pad. A common conducting lead is provided on the opposite surface of the support, that is, the surface opposite to that on which the electrical conducting leads 26 are deposited; and wire bonds extend between the common conducting lead and each of the semiconductor elements.

Figure 8B:
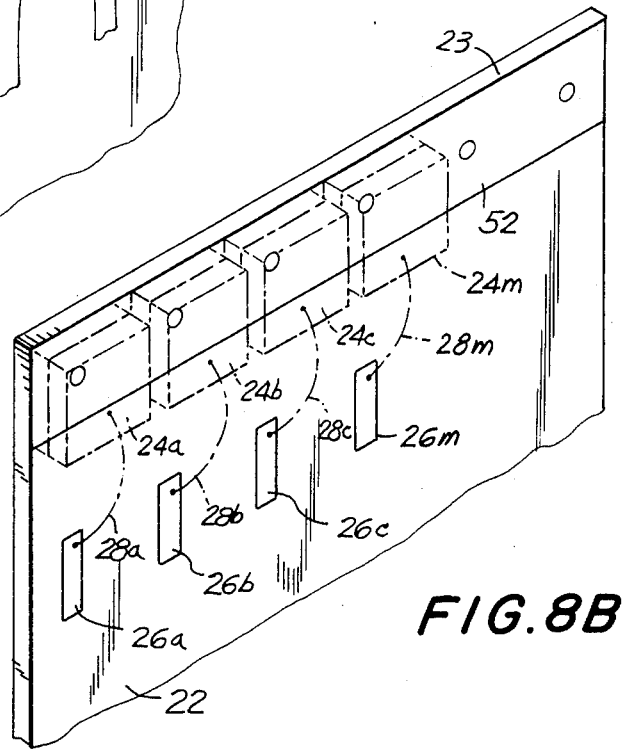

FIG. 8B is a perspective schematic diagram similar to that shown in FIG. 4, wherein each semiconductor element is mounted by solder or other conventional electrical bonding to common conducting lead 52. For example, the N-type material in each element may be connected to the common conducting lead. The material on the other side of the PN junction in each element, for example, the P-type material, is connected by a respective wire bond 28a, 28b, . . . 28m, to a corresponding electrical conducting lead 26a, 26b, . . . 26m.

It is contemplated that various techniques may be used in the embodiments described above by which each semiconductor element is electrically connected to the common conducting lead deposited on support 22. For example, conductive epoxy may be used to bond each element to the common conducting lead. Alternatively, solder, such as gold solder, may be used; and in one technique, ultrasound may be employed to melt the solder and thereby connect each element to the common conducting lead. As yet another technique, electrostatic welding may be used to bond each element to the common conducting lead. These techniques also may be used in the embodiment shown in FIG. 8A by which each semiconductor element is bonded to the mounting pad of a respective conducting lead 26.

Likewise, the wire bond that is used to connect each semiconductor element to a respective conducting lead 26 (or, in the embodiments shown in FIGS. 1A and 8A, to the common conducting lead), may be welded between each element and the conducting lead by means of conventional gold spot welding.

In the embodiments described hereinabove, the semiconductor elements may be formed by, for example, epitaxially growing a generally rectangular block of suitable semiconductor material on a thin substrate, such as a thin sapphire substrate. Then, the individual elements may be formed by suitable etching techniques. The entire unit containing the sapphire substrate and individually etched elements then may be mounted either on the leading edge or on a surface adjacent the leading edge of support 22.

Yet another embodiment by which a linear array of semiconductor elements may be suitably mounted on a support with appropriate electrical connections thereto is illustrated schematically in FIGS. 9A–9C. Initially, a plurality of electrical conducting leads 26a, 26b, ... 26m are deposited on, for example, one surface of support 22, each deposited lead extending to the edge of the support. Similar conducting leads 29a, 29b, ... 29m are deposited on the opposite surface of the support, these conducting leads 29 extending substantially parallel to and opposite conducting leads 26.

Suitable control circuitry may be mounted on one or both surfaces of the support, such as shown schematically in FIG. 1B. Such control circuitry is electrically connected to at least some of leads 26a ... 26m and/or some of leads 29a ... 29m. Additionally, output terminals, similar to aforedescribed output terminals 31, may be deposited on one or both surfaces of the support; and the aforementioned control circuitry also may be electrically connected to selected ones, or all, of these output terminals.

Prior or subsequent to the mounting and connection of the control circuitry in the aforesaid manner, as may be desired, a predetermined peripheral edge section of support 22 is removed. As shown in FIG. 9B, the removal of this edge section results in extensions of conducting leads 26a ... 26m and extensions of conducting leads 29a ... 29m projecting beyond the remaining leading edge 23.

Then, as shown in FIG. 9C, the array of semiconductor elements 24a ... 24m is inserted between the respective projections of conducting leads 26a, 29a, 26b, 29b, ... 26m, 29m, respectively. That is, the array of semiconductor elements replaces the section of support 22 that had been removed. Next, the projections of the respective conducting leads on both surfaces of support 22 are soldered or otherwise electrically bonded to the semiconductor elements.

FIG. 10 is a side schematic representation of the projections of, for example, conducting leads 26a and 29a, which sandwich semiconductor element 24a. FIG. 11 is another side schematic representation of the sandwiching of semiconductor element 24a between these projections of the respective conducting leads. It is seen that, in the FIG. 10 embodiment, X-radiation is transmitted in a direction substantially parallel to the PN junction included in the semiconductor elements; and in the FIG. 11 embodiment, the X-radiation is transmitted in a direction substantially normal to the PN junction.

As an alternative to the fabrication technique represented by FIGS. 9A–9C, a common conducting lead may be deposited on one surface of support 22 in place of, for example, individual conducting leads 29a ... 29m. Nevertheless, the respective semiconductor elements are inserted to be sandwiched between this common conducting lead which projects beyond leading edge 23 of support 22 and a respective projection of conducting lead 26a ... 26m. Thus, in both embodiments described herein, each semiconductor element is supported between leading edge 23 of support 22 and the projection of at least one electrical conducting lead (e. g. the projection of a conducting lead 26).

In the embodiment schematically illustrated in FIG. 11, it will be appreciated that the P-type material is electrically connected only to, for example, conducting lead 26a; and the N-type material is electrically connected only to conducting lead 29a. Suitable insulating material may be provided between the P-type material and conducting lead 29a and, similarly, insulating material may be provided between the N-type material and conducting lead 26a.

FIGS. 12–15 are schematic diagrams representing respective side views of assembled X-ray receptors in accordance with the aforementioned embodiments. In each assembly, n supports are physically retained by a circuit board connector 80 which provides physical support therefor and electrical interconnections between the output terminals normally provided on each support and further apparatus. In FIGS. 12–15, the further apparatus is illustrated as a central processing unit (CPU) 90 which functions inter alia to control the scanning of the semiconductor elements and the processing of the imaging signals produced by those elements in response to impinging X-radiation.

Figure 12:
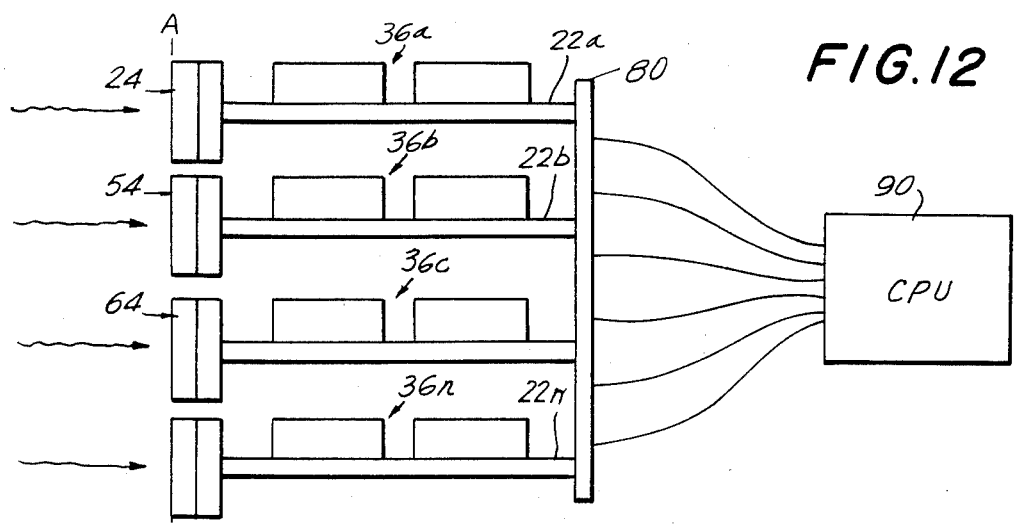
FIGS. 12-15 are schematic diagrams representing different embodiments of an X-ray receptor, in accordance with the present invention, electrically connected to a signal processor.

In particular, FIG. 12 represents a matrix array formed by a plurality of supports of the type shown in FIGS. 1A and 1B. It is appreciated that the embodiment of FIG. 12 is a schematic side view of the embodiment shown in the perspective diagram of FIG. 2.

Figure 13:
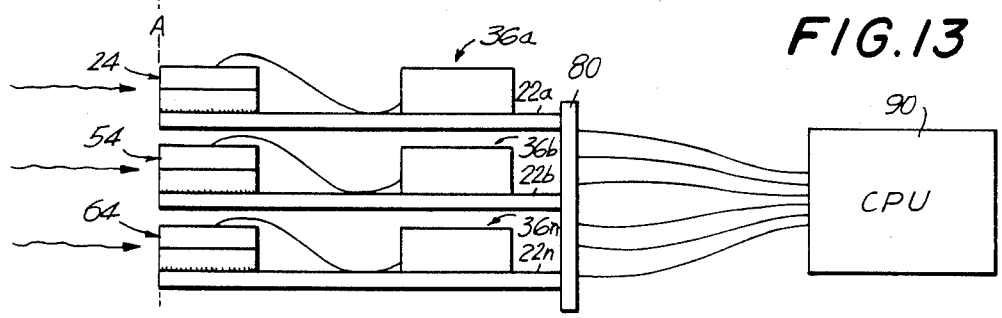

FIG. 13 represents a matrix array formed by plural supports of the type shown in FIG. 4. The embodiment of FIG. 13 is seen to be a more representative diagram of the embodiment shown in FIG. 7. That is, FIG. 13 illustrates, in addition to arrays 24, 54 and 64 of FIG. 7, the use of control circuitry 36a, 36b, ... 36n supported on insulating supports 22a, 22b, ... 22n, respectively. As in the FIG. 12 embodiment, circuit board connector 80 provides mechanical support for the supports and also provides electrical interconnections between the circuitry mounted on those supports and CPU 90.

Figure 14:
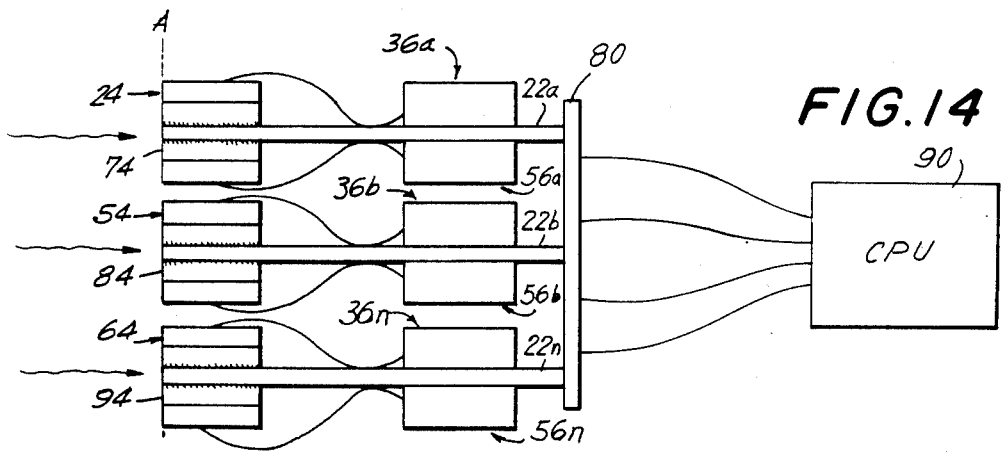

FIG. 14 illustrates a matrix array formed by a plurality of supports of the type shown in FIG. 5. It is seen that FIG. 14 is a more representative diagram of the matrix array partially shown schematically in FIG. 6. Circuit board connector 80 provides mechanical support for the n supports and also provides electrical interconnections between the circuitry mounted on such supports and CPU 90.

Figure 15:
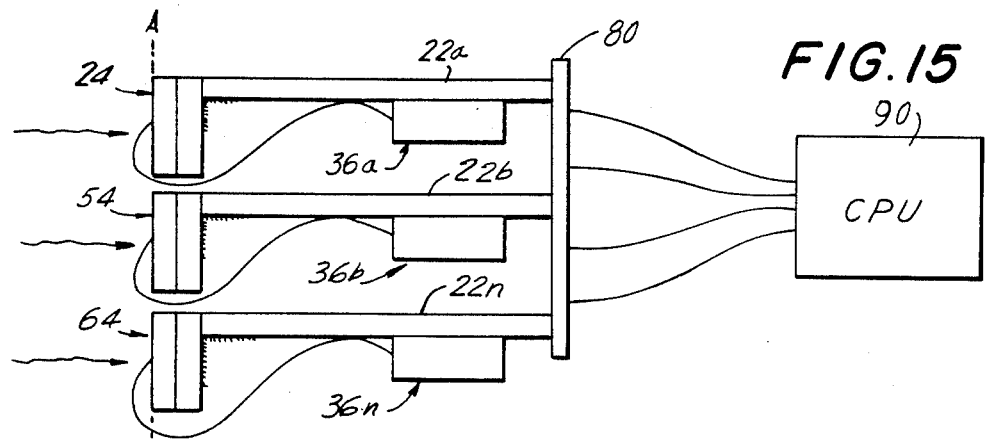

FIG. 15 schematically illustrates a matrix array formed of n supports having semiconductor elements mounted thereon in the manner illustrated schematically in FIG. 3.

Figure 16:
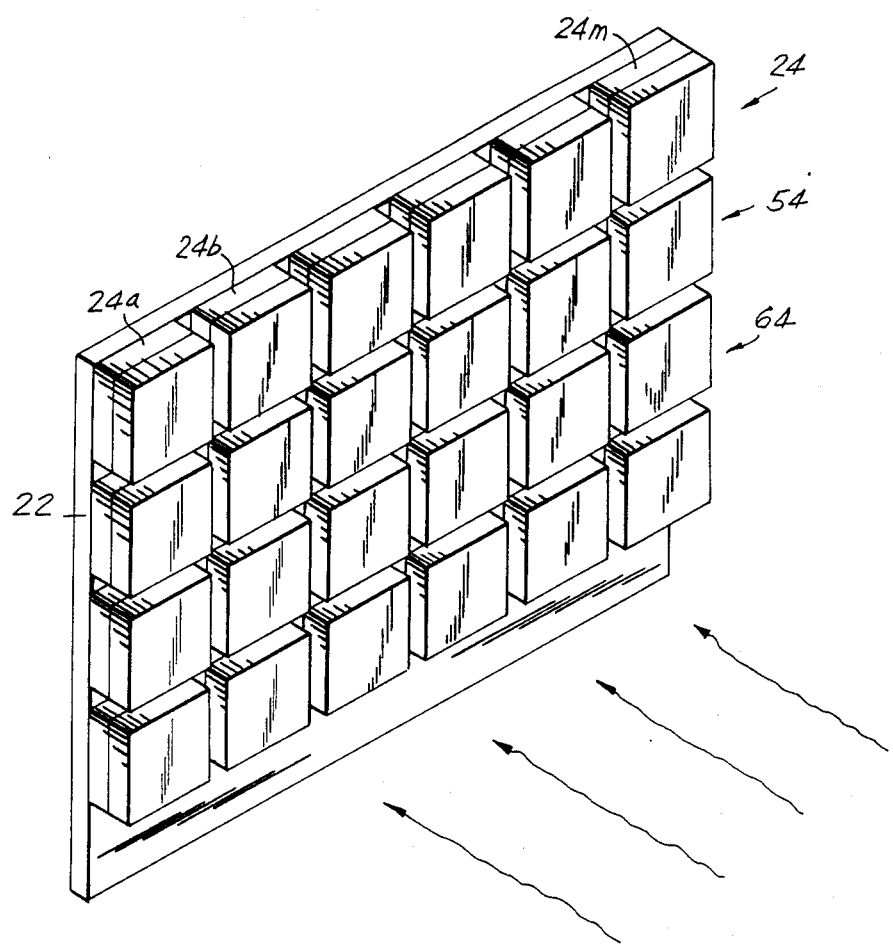
FIG. 16 is a perspective, schematic diagram of yet another embodiment of an m×n matrix array of X-ray responsive semiconductor elements.

In the embodiments of FIGS. 12–15, the m×n matrix array of semiconductor elements is formed of n supports upon each of which are mounted m semiconductor elements (in FIG. 14, it is seen that 2m, or two arrays, of semiconductor elements are mounted on each support). A further embodiment of the X-ray receptor in accordance with the teachings of the present invention is illustrated in FIG. 16. In this embodiment, the m×n matrix array of semiconductor elements is mounted on one surface of support 22. That is, n separate linear arrays (or rows), each array including m semiconductor elements (or m columns), are mounted on the surface of the support. In the illustrated embodiment, one surface of each semiconductor element is mounted by solder or other electrical bonding to respective electrical conducting leads (not shown) on the support, and the other surface of each semiconductor element lies in a plane which is substantially parallel to the surface of the support and which receives impinging X-radiation.

In an X-radiation receptor of the type shown in FIG. 16 and having, as a numerical example, a matrix array of 1024×1024 semiconductor elements, the matrix array may be formed of 64 matrix sub-arrays. Each sub-array may be constructed with 64×64 semiconductor elements, and then each sub-array may be assembled in a final, 8×8 array. That is, each sub-array may have 64×64 semiconductor elements mounted on a circuit board of the type shown in FIG. 16, and an array of 8×8 circuit boards, each having these semiconductor elements mounted thereon, then may be assembled.

The embodiment shown in FIG. 16 exhibits an advantage in that it is relatively easier to assemble than the so-called edge-mount array of FIGS. 1, 2 and 3, or the so-called peripheral mount array of FIGS. 4–8. That is, a matrix sub-array may be assembled in its entirety in one step. However, if individual ones of the semiconductor elements in such sub-arrays are defective, it generally is difficult to replace such defective elements. Rather, an entire row or column of elements would be replaced. The edge mount arrays (FIGS. 1-3) or peripheral mount arrays (FIGS. 4-8) offer the advantage of enabling the replacement of individual semiconductor elements in the event that such elements are defective. However, the assembly of such edge mount and peripheral mount arrays is more time-consuming than that of the matrix array.

The electrical signals produced by the semiconductor elements of the matrix array shown in FIG. 16 may be scanned by conventional multiplexing techniques of the type described above. The multiplexed signals then are transmitted from suitable output terminals (not shown) to a signal processor.

In the aforementioned embodiments of the edge mount, peripheral mount and matrix arrays, the electrical conducting leads to which the respective semiconductor elements are connected have been described as being deposited on the surface of support 22. As an alternative, the support may be formed as a conventional sandwich, or multi-layer circuit board; and the electrical conducting leads may be deposited or otherwise formed on the various layers thereof.

The invention described hereinabove is directed to a solid-state X-ray receptor formed as a matrix array of m×n semiconductor elements. The X-ray receptor provides electrical output signals representing X-ray image information impinging upon the receptor surface of the device. Such electrical signals may be suitably processed by, for example, a central processing unit, or may be used directly to display a viewable image on a cathode ray tube of the subject being X-rayed. Although the present device has been designed primarily for medical applications, it should be readily appreciated that the instant invention is not limited solely to this use. Nevertheless, the medical applications of the present invention are highly desirable because the semiconductor elements are satisfactorily responsive to impinging X-radiation such that relatively low-level X-radiation can be used to obtain satisfactory X-ray images. That is, the semiconductor elements described above exhibit a relatively fast response time and, moreover, exhibit a relatively large dynamic range and high sensitivity to impinging X-radiation. It is contemplated that the electrical signals produced by the semiconductor elements are scanned at a rate on the order of 20 MHz to about 200 MHz. This is a satisfactory rate such that 10-200 image frames per second are produced by a 1024×1024 matrix. This, in turn, provides real time viewing on a cathode ray tube of an active organ that is subjected to a steady bombardment of X-radiation. Alternatively, this rate is sufficient to provide an accurate image of an organ that is exposed to a flash of X-radiation. It will be appreciated that, if the duration of such X-ray flash is less than the time required to scan all the semiconductor elements, a suitable signal buffer may be used to store temporarily the signals produced by such elements until those signals may be scanned and processed.

While the present invention has been particularly shown and described with reference to certain preferred embodiments, it will be appreciated by those of ordinary skill in the art that various changes and modifications in form and details may be made without departing from the spirit and scope of the invention. For example, in forming each linear array (or, in the embodiment of FIG. 16, the matrix array) of semiconductor elements, a "block" may be fabricated and that block then may be subdivided into individual semiconductor elements by, for example, the etching technique mentioned above or, alternatively, by use of a conventional diamond saw or other abrasive cutting device conventionally used in the fabrication of semiconductor chips and elements. Furthermore, and as a numerical example, each semiconductor element, if rectangular in shape, typically exhibits a width of about 0.0156 inches and a thickness of about 0.005 inches. The ceramic board which comprises the support may have a thickness on the order of about 0.003 inches. In the embodiment of FIG. 12, the center-to-center separation between adjacent ceramic boards is seen to be at least 0.031 inches, depending upon the desired spacing between vertically aligned semiconductor elements. Preferably, the thickness of circuitry 36 is no greater than the thickness of the semiconductor element which, it is seen, determines the minimum separation between ceramic boards in FIGS. 13 and 14. It is intended that the appended claims be interpreted as including those changes and modifications which are equivalent to the disclosed embodiments and to those modifications and alternatives which appear obvious to those of ordinary skill in the art.

What is claimed is:

1. A receptor for X-radiation to produce electrical signals representative of an X-ray image, comprising: at least one support comprised of a ceramic board having surfaces for supporting electrical conducting leads and circuit means; a linear array of semiconductor elements supported on said ceramic board and positioned to receive impinging X-radiation and to produce electrical signals in response thereto; plural electrical conducting leads supported on at least one surface of said ceramic board; means for coupling the electrical signals produced by respective ones of said semiconductor elements to at least one of said electrical conducting leads; output terminal means supported on said ceramic board to provide output image signals; and circuit means supported on said ceramic board for coupling the electrical signals from said at least one electrical conducting lead to said output terminal means; and wherein the electrical conducting leads supported on said surface of said ceramic board project beyond the edge of said ceramic board and said array of semiconductor elements is supported between the edge of said ceramic board and the projections of said electrical conducting leads. image signals; and circuit means supported on said at least one support for coupling the electrical signals from said at least one electrical conducting lead to said output terminal means.

2. The receptor of claim 1 wherein said at least one support comprises a ceramic board; and wherein said array of semiconductor elements is a linear array mounted on the edge of said at least one ceramic board.

3. The receptor of claim 2 wherein said linear array of semiconductor elements includes a surface area upon which the X-radiation impinges; wherein said at least one ceramic board includes a surface on which at least one of said electrical conducting leads and said multiplex means are supported; and wherein said surface area of said semiconductor elements lies substantially in a plane that is generally normal to said surface of said at least one ceramic board.

4. The receptor of claim 1 comprised of plural supports; and wherein a respective linear array of semiconductor elements is mounted on each support, each linear array including a surface area upon which the X-radiation impinges, the surface area of said linear arrays forming an X-radiation receptor plane that is generally normal to the surfaces of said supports.

5. The receptor of claim 4 further comprising holding means for holding said plural supports and including interconnect means for interconnecting the output terminal means supported on said supports to further apparatus, said holding means holding n supports each of which supports m semiconductor elements, whereby said receptor is comprised of an n×m matrix array of semiconductor elements.

6. The receptor of claim 3 wherein one of said plural electrical conducting leads comprises a common conducting lead supported on a surface of said at least one ceramic board; and means for electrically connecting each of said semiconductor elements in said linear array to said common conducting lead.

7. The receptor of claim 1 wherein said at least one support comprises a ceramic board having surfaces on which said electrical conducting leads and said circuit means are supported; and wherein said array of semiconductor elements is comprised of at least one linear array mounted on at least one of said surfaces adjacent the edge of said at least one ceramic board.

8. The receptor of claim 7 wherein one linear array of semiconductor elements is mounted on one surface of said at least one ceramic board.

9. The receptor of claim 7 wherein one linear array of semiconductor elements is mounted on one surface of said at least one ceramic board and another linear array of semiconductor elements is mounted on an opposite surface of said ceramic board.

10. The receptor of claim 7 wherein one of said plural electrical conducting leads comprises a common conducting lead supported on a surface of said ceramic board; and means for electrically connecting each of said semiconductor elements in said at least one linear array to said common conducting lead.

11. The receptor of claim 1 wherein said at least one support comprises a ceramic board having surfaces on which said electrical conducting leads and said circuit means are supported, said electrical conducting leads on at least one surface projecting beyond the edge of said ceramic board; and wherein said array of semiconductor elements is a linear array supported between said edge of said ceramic board and the projections of said electrical conducting leads.

12. The receptor of claim 11 wherein electrical conducting leads are supported on opposite surfaces of said ceramic board and project beyond said edge thereof, said linear array of semiconductor elements being further supported between the projections of the electrical conducting leads on both surfaces of said ceramic board.

13. The receptor of claim 12 wherein each semiconductor element has a PN junction with the material on one side of said PN junction in each semiconductor element being electrically connected to a respective projection of an electrical conducting lead on one surface of said ceramic board and the materialk on the other side of said PN junction being electrically connected to a projection of an electrical conducting lead on the other side of said ceramic board.

14. The receptor of claim 1 wherein said array of semiconductor elements is an n×m matrix array mounted on a surface of said support.

15. A method of producing a receptor for X-radiation comprising the steps of depositing plural electrical leads on at least one surface of a support board; depositing output leads on at least one surface of said support board; mounting electrical circuitry on at least one surface of said support board; electrically connecting said electrical circuitry to at least some of said electrical leads and to at least some of said output leads; mounting an array of semiconductor elements on said support board in the vicinity of a peripheral edge of said support board, each semiconductor element being formed of gallium aluminum arsenide and having a PN junction therein and being responsive to X-radiation impining thereon to produce a corresponding electrical signal; electrically connecting the material on one side of the PN junction in each said semiconductor element to a respective one of at least a portion of said electrical leads; and electrically connecting the material on the other side of said PN junction to a common electrical lead.

16. The method of claim 15 wherein said array of semiconductor elements is mounted on said peripheral edge of support board, said semiconductor elements having a surface area on which said X-radiation impinges that lies in a plane substantially normal to the surface of the support board on which said electrical circuitry is mounted.

17. The method of claim 15 wherein said array of semiconductor elements is mounted on a surface of said support board adjacent said peripheral edge of said support board.

18. The method of claim 15 wherein said step of electrically connecting the material on one side of said PN junction to an electrical lead comprises bonding a wire between said material and said lead.

19. The method of claim 15 wherein said step of electrically connecting the material on one side of said PN junction to an electrical lead comprises soldering said semiconductor element directly to said lead.

20. The method of claim 15 wherein some of said electrical leads are deposited on one surface of said support board and extend to an edge thereof and others of said electrical leads are deposited on the other opposite surface of said support board and extend to said edge in parallel with and opposite to said some electrical leads; and wherein said step of mounting an array of semiconductor elements comprises removing a predetermined peripheral edge section of said support board bounded by the electrical leads on both surfaces thereof, whereby the electrical leads project beyond the edge of the remainder of said support board, replacing the removed section with said array of semiconductor elements, and electrically connecting said semiconductor elements to the electrical leads on both surfaces of said support board.

* * * * *

UNITED STATES PATENT AND TRADEMARK OFFICE
CERTIFICATE OF CORRECTION

PATENT NO. : 4,700,076
DATED : October 13, 1987
INVENTOR(S) : Arthur Dorman et al.

It is certified that error appears in the above-identified patent and that said Letters Patent is hereby corrected as shown below:

The claims should read as follows:

1. A method of producing a receptor for X-radiation comprising the steps of depositing plural electrical leads on one surface of a support board, said plural electrical leads extending to an edge thereof; depositing other electrical leads on the other opposite surface of said support board, said other electrical leads extending to said edge in parallel with and opposite to said plural electrical leads; depositing output leads on at least one surface of said support board; mounting electrical circuitry on at least one surface of said support board; electrically connecting said electrical circuitry to at least some of said electrical leads and to at least some of said output leads; removing a predetermined peripheral edge section of said support board bounded by the electrical leads on both surfaces thereof, whereby the electrical leads project beyond the edge of the remainder of said support board, replacing the removed section with an array of semiconductor elements, and electrically connecting said semiconductor elements to the electrical leads on both surfaces of said support board, each semiconductor element having a PN junction therein and being responsive to X-radiation impinging thereon to produce a corresponding electrical signal.

2. A receptor for X-radiation to produce electrical signals representative of an X-ray image, comprising: at least one support comprised of a ceramic board having surfaces for supporting electrical conducting leads and circuit means; a linear array of semiconductor

UNITED STATES PATENT AND TRADEMARK OFFICE
CERTIFICATE OF CORRECTION

PATENT NO. : 4,700,076

DATED : October 13, 1987

INVENTOR(S) : Arthur Dorman et al.

It is certified that error appears in the above-identified patent and that said Letters Patent is hereby corrected as shown below:

elements supported on said ceramic board and positioned to receive impinging X-radiation and to produce electrical signals in response thereto; plural electrical conducting leads supported on at least one surface of said ceramic board; means for coupling the electrical signals produced by respective ones of said semiconductor elements to at least one of said electrical conducting leads; output terminal means supported on said ceramic board to provide output image signals; and circuit means supported on said ceramic board for coupling the electrical signals from said at least one electrical conducting lead to said output terminal means; and wherein the electrical conducting leads supported on said surface of said ceramic board project beyond the edge of said ceramic board and said array of semiconductor elements is supported between the edge of said ceramic board and the projections of said electrical conducting leads.

UNITED STATES PATENT AND TRADEMARK OFFICE
CERTIFICATE OF CORRECTION

PATENT NO. : 4,700,076

DATED : October 13, 1987

INVENTOR(S) : Arthur Dorman, et al.

It is certified that error appears in the above-identified patent and that said Letters Patent is hereby corrected as shown below:

3. The receptor of Claim 2 wherein electrical conducting leads are supported on opposite surfaces of said ceramic board and project beyond said edge thereof, said linear array of semiconductor elements being further supported between the projections of the electrical conducting leads on both surfaces of said ceramic board.

Signed and Sealed this

Second Day of May, 1989

*Attest:*

DONALD J. QUIGG

*Attesting Officer*       *Commissioner of Patents and Trademarks*